United States Patent [19]

Kaiser

[11] Patent Number: 4,711,256
[45] Date of Patent: Dec. 8, 1987

[54] METHOD AND APPARATUS FOR REMOVAL OF SMALL PARTICLES FROM A SURFACE

[76] Inventor: Robert Kaiser, 12 Glengarry, Winchester, Mass. 01890

[21] Appl. No.: 725,062

[22] Filed: Apr. 19, 1985

[51] Int. Cl.[4] .................. B08B 3/02; B08B 30/00; B08B 3/12
[52] U.S. Cl. .................. 134/25.4; 134/26; 134/30; 134/1; 148/DIG. 17
[58] Field of Search .................. 134/26, 30, 25.4, 1

[56] References Cited

U.S. PATENT DOCUMENTS

| 3,784,471 | 1/1974 | Kaiser | 252/62.56 X |
| 3,904,430 | 9/1975 | Tipping et al. | 134/26 X |
| 3,957,531 | 5/1976 | Tipping et al. | 134/30 X |
| 4,091,826 | 5/1978 | Bahrke | 134/30 X |
| 4,156,619 | 5/1979 | Griesshamner | 134/26 X |
| 4,269,630 | 5/1981 | Stephenson et al. | 134/26 |

FOREIGN PATENT DOCUMENTS

| 2541613 | 3/1977 | Fed. Rep. of Germany | 134/25.4 |
| 53-132173 | 11/1978 | Japan | 134/26 |
| 56-28684 | 3/1981 | Japan | 134/26 |
| 1399867 | 7/1975 | United Kingdom | 134/30 |

OTHER PUBLICATIONS

Particle Contamination and Device Performance, Duffalo et al., Solid State Tech., Mar. 1984, pp. 109–114.
Chemical Technology of Microelectronics, Larrobee, Chem. Tech., Mar. 1985, pp. 168–174.

Primary Examiner—Andrew H. Metz
Assistant Examiner—William G. Wright
Attorney, Agent, or Firm—Cesari and McKenna

[57] ABSTRACT

A method for the removal of sub-micron contaminant particles from a surface, such as the surface of a semiconductor wafer. The method comprises washing the contaminated surface in a cleaning solution of a high-molecular-weight highly-fluorinated organic surfactant in a non-ionic highly-fluorinated organic carrier. The surface is then rinsed with a rinsing liquid, which is also a highly-fluorinated organic liquid, and which may be the same as the carrier liquid. In a preferred embodiment, a cascade rinsing method is provided in which the rinsing liquid for each rinsing step is the effluent of the subsequent rinsing step. In a further embodiment, the rinsing liquid has a lower boiling point than the surfactant to permit regeneration of the rinsing liquid by distillation of rinse effluent.

14 Claims, 1 Drawing Figure

METHOD AND APPARATUS FOR REMOVAL OF SMALL PARTICLES FROM A SURFACE

FIELD OF THE INVENTION

This invention relates to removal of very small particles from various surfaces, more particularly to cleaning of surfaces that have become contaminated with such particles. The invention is especially useful in the cleaning of semiconductor wafers that have become contaminated with particulate matter during various manufacturing operations and must be freed of the contaminants prior to the performance of subsequent operations.

BACKGROUND OF THE INVENTION

Manufacture of semiconductor integrated circuits consists of a number of operations. A semiconductor wafer is first doped by diffusion with p-type or n-type material, then an insulating oxide layer is formed on the surface, after which conductive paths are formed by selective etching of the oxide layer. The semiconductor wafer is then doped with more impurities. The latter operations may be repeated a number of times. During some of these operations it is important that the surface of the wafer be essentially free of contaminants.

The contaminants to which this invention is directed are small particles. Particles on the surface of the wafer can interfere with some of the processing operations. For example, if a conductive path has been etched on the wafer surface and diffusion is to be accomplished through that path into the wafer, a particle located on that path and having a diameter of the order of the path width or greater will cause an unwanted gap in the diffusion pattern.

Unfortunately, these particles are generated during some of the processing steps. For example, when lines are etched in the oxide layer of a silicon wafer, some of the removed material can redeposit in particulate form elsewhere on the surface of the wafer. These particles must be removed from the surface of the wafer before the performance of subsequent operations with which they might interfere. The particles may be cleaned from the wafer by chemical removal (e.g. reaction with an acid or base), centrifugation, air-stream or water-jet cleaning, mechanical scrubbing, ultrasonic agitation or other known processes. The type of cleaning action depends on the contaminant form, the type of material to be cleaned, and the degree of cleanliness required.

With advances in integrated circuit manufacturing techniques, higher and higher circuit densities have been achieved, with correspondingly finer features on the semi-conductor surface. For example, the minimum feature size of a one-megabyte dynamic RAM chip will be about 1.25 microns, and production chips with architectural features of sub-micron size can be anticipated. Accordingly, even very small particles can cause problems and have to be removed from the wafer surface. Adhesion of such small particles to the surface of the wafer is believed to be due mainly to secondary valence interaction between the particle and the wafer surface (van der Waals forces). The ratio of the force of attraction to the weight of the particle increases as the size of the particle decreases.

Removal of sub-micron sized particles from a solid substrate is not a new problem. It has been a widely recognized problem for several decades. (See, "Cleaning of Electronic Device Components and Materials", Am. Soc. for Testing and Materials, 1958 and "Symposium on Cleaning and Material Related Processing for Electronics and Space Apparatus", Am. Soc. for Testing and Materials, 1962).

Difficulties of removal of particulate contamination with particles sizes below one micron are discussed. (See, J. M. Duffalo & J. R. Monkowski "Particulate Contamination and Device Performance", Solid State Technology, Mar. 1984, p. 109–114, and O. Hamberg and E. M. Shon "Particle Size Distribution on Surfaces in Clean Rooms", Proceedings-Institute of Environmental Sciences, 1984, p. 14–19). Hamberg and Shon in particular discuss the surface cleaning efficiency with such materials as trichlorotrifluoroethane marketed by E. I. DuPont de Nemours & Co., Inc. under the Freon Tf tradename. As the size of the particles to be removed decreases below one micron a very small proportion of the particles are removed by this method.

Indeed it is now generally believed that it is not possible to remove sub-micron sized particles from solid surfaces by known methods and this is an important issue to be resolved. (See, G. B. Larrabee "Chemical Technology of Microelectronics", Chemtech, Mar. 1985, p. 168–174).

It is therefore the object of the invention to provide an effective method and apparatus for removal of small particles from solid surfaces and in particular from the surfaces of semiconductor wafers.

SUMMARY OF THE INVENTION

We have found that solutions of high-molecular-weight highly-fluorinated organic surfactants in highly-fluorinated organic carrier liquids are effective to remove relatively small contaminant particles from the surfaces of semiconductor wafers. When a contaminated wafer is immersed in such a solution, the surfactant adsorbs on the surface of the wafer and also on the surfaces of any foreign particles present on the wafer surface. This provides solvated films, which reduce the interaction between these surfaces and, in particular, between the surfaces of the particles and the surface of the wafer. The particles therefore readily detach from the wafer surface and disperse in the solution.

Mechanical agitation, as provided, for example, by an ultrasonic generator, can be applied to promote the dispersion. However, we have found that the thermal (Brownian) movement of the liquid molecules can be sufficient to displace the particles from the surface of the wafer.

Because the surface of the wafer is covered by a surfactant film, the wafer is rinsed in fresh carrier liquid, after the particles are removed, to remove the surfactant from the wafer surface. The rinsing process is performed under conditions that favor desorption of the surfactant, e.g. elevated temperature, and is repeated until the concentration of adsorbed surfactant has decreased to an acceptable level. Any residual rinsing liquid remaining on the surface of the wafer can easily be removed mechanically (e.g. centrifugation) or by evaporation.

The carrier liquids used in the cleaning operations should not leave behind any residues. Also, they should not alter the physical or chemical properties of the wafer in any way other than the removal of the contaminating particles. They must also be compatible with the established operating practices of the semiconductor industry. These requirements can be satisfied by the use of certain highly-fluorinated liquids.

We use the term "highly-fluorinated" to refer to liquids which contain at least one fluorine atom per carbon atom, with up to one half of the atoms attached to the carbon atoms being halogen atoms or hydrogen atoms. These liquids exhibit, as a class, a high degree of inertness and resistance to chemical attack. They are non-polar and have essentially no solvent action. Also they are non-flammable and have a low order of toxicity. They also have an affinity for other highly-fluorinated liquids.

Examples of highly-fluorinated carrier liquids include the following liquids which have been marketed under the Freon registered trademark by E. I. Du Pont Nemours & Co., Inc.:

Freon TF—Trichlorotrifluoroethane, $CCl_2FCClF_2$
Freon 114B2—Dibromotetrafluoroethane, $CBrF_2CBrF_2$
Freon 215—Trichloropentafluoropropane, $CCl_3CF_2CF_3$
Freon 214—Tetrachlorotetrafluoropropane, $CCl_3CF_2CF_2Cl$
Freon E Liquids—

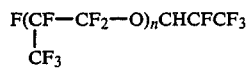

where n=1 to 3

Preferred carrier liquids for the purpose of this invention are perfluorinated liquids, i.e. that contain only carbon and fluorine, and in some cases other non-hydrogen atoms, such as oxygen, or nitrogen. Preferably they have a boiling point at ambient pressure in the range of from 35° C. to 150° C. to facilitate removal of the carrier liquid by evaporation at temperatures that do not harm the object being cleaned.

The following are examples of commercially available preferred carrier liquids:

Fluorocarbon Electronic Liquid FC 104, the trade designation of a perfluoroalkane, predominently perfluorooctane ($C_8F_{18}$), with an average molecular weight of 435, marketed by 3M Corporation.

Fluorocarbon Electronic Liquid FC 75, the trade designation of a perfluorinated cyclic ether containing 8 carbon atoms with an average molecular weight of 420, marketed by 3M Corporation.

Fluorocarbon Electronic Liquid FC 77, the trade designation of an azeotropic mixture of Fluorocarbon Electronic Liquid FC 75 and of Fluorocarbon Electronic Liquid FC 104 with an average molecular weight of 415.

The highly-fluorinated surfactants useful in the invention are soluble in the carrier liquids. Preferably they are perfluorinated and contain at least ten, preferably 20 to 100, carbon atoms and one or more polar groups capable of interacting with a solid surface. These polar groups include species with active hydrogen atoms, such as carboxylic acids, sulfonic acids, and alcohols. The surfactant preferably has a higher boiling point than the carrier liquid with which it is used.

It is important that the surfactant can be easily removed from the surface to be cleaned, as by rinsing with the carrier liquid. Otherwise the cleaning process will merely result in the substitution of one contaminant for another. Other surfactants that may detach particles from the surface are not suitable, because they are not so easily removed as the class of surfactants described herein.

Indeed, the combination of carrier liquid and surfactant is also important, since the carrier liquid and surfactant must be compatible and the carrier liquid must have the characteristics specified above.

Even the addition of a trace amount of surfactant to the carrier liquid results in significant removal of particles. Thus, concentrations ranging from as low as 0.01 weight percent, up to the solubility limit, can be used. The preferred concentration of surfactant in the carrier liquid is in a range of 0.2 to 2.0 weight-percent.

The relatively high molecular weight of the surfactant is desirable in order to make the surfactant highly miscible with the carrier liquid and also to enhance the separation of the particles from the surface to be cleaned.

The following are examples of commercially available preferred surfactant materials:

Krytox 157 FS (L), the trade designation of perfluoroalkylpolyether terminated by a carboxylic acid end group, which has an average molecular weight of about 2,000, marketed by E. I. DuPont de Nemours & Co., Inc.

Krytox 157 FS (M), the trade designation of perfluoroalkylpolyether terminated by a carboxylic acid end group, which has an average molecular weight of about 4,000, marketed by E. I. DuPont de Nemours & Co., Inc.

Krytox 157 FS (H), the trade designation of perfluoroalkylpolyether terminated by a carboxylic acid end group, which has an average molecular weight of about 6,000, marketed by E. I. DuPont de Nemours & Co., Inc.

Fomblin Z Diacid Fluid, the trade designation of a straight chain perfluorinated polyether polymer terminated by two carboxylic acid groups with an approximate molecular weight of 2,000, marketed by Montedison USA, Inc.

Perfluorodecanoic acid, represented by the chemical formula $C_9F_{19}COOH$ with a molecular weight of 514, as marketed by SCM Specialty Chemicals.

Since the carrier liquids and the surfactants used by this invention are inert and poor solvents for other classes of compounds, the chemistry and composition of the surface to be cleaned and of the particles to be removed do not influence the process.

Surfaces that can be cleaned include metals, ceramics and plastics, including the surfaces of fabricated objects that contain more than one material. In addition to semi-conductor materials in various forms, articles where surfaces may be advantageously cleaned by means of the present invention include photomasks used in the manufacture of semiconductors; carrying boxes, holders and similar equipment used in the manufacture of semiconductors; precision optical equipment and components; and precision electromechanical equipment and components.

U.S. Pat. No. 3,784,471 to R. Kaiser describes the dispersion of particulate solids in solutions of the general type carrier liquid and the surfactant used herein. However, until now it has not been recognized that these solutions can be used to remove sub-micron particles from solid surfaces. In fact those familiar with perfluorinated liquids reported the lack of success in removing sub-micron particles from surfaces by the use of Freon TF, one of the carrier liquids described herein.

(See, O. Hamberg & E. M. Shon, "Particle Size Distribution on Surfaces in Clean Rooms", Proceedings- Institute of Environmental Sciences, 1984, p. 14–19).

DESCRIPTION OF THE DRAWINGS

For a fuller understanding of a nature and objects of the invention, reference should be made to the following detailed description, taken with connection with the accompanying drawing figure.

DETAILED DESCRIPTION OF THE INVENTION

Figure 1:
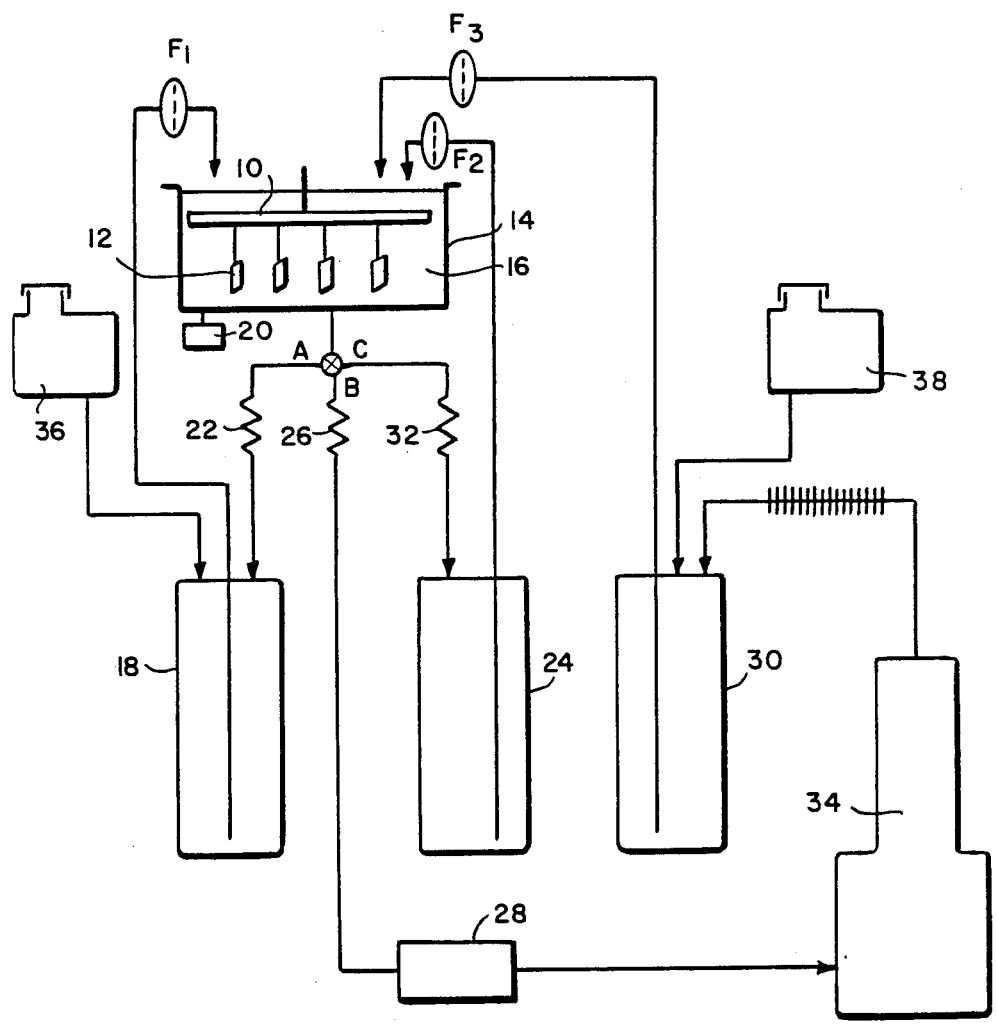
FIG. 1 is a schematic illustration of apparatus embodying the invention.

As shown in FIG. 1, racks 10 carrying contaminated wafers 12 are placed in a tank 14. A washing bath 16a, containing a solution of a surfactant in a carrier liquid, is introduced to the tank 14 from a tank 18 through a filter F1. The contents of the tank 14 are subjected to agitation by an ultrasonic agitator 20. Adsorption of the surfactant on the surfaces of the wafers 12, and also on the surfaces of particles to be removed from the wafer surfaces, reduces the interaction between these surfaces. The particles are thus detached from the surfaces of the wafers 12 and become dispersed in the bath 16a, where they may settle or remain in suspension, depending on such factors as particle size, the degree of agglomeration and the degree of agitation. After the washing process is completed (1 to 100 minutes, inclusive of a possible pre-soak step), the bath 16a is drained slowly through a valve A and flow restrictor 22 back to tank 18.

A film containing surfactant remains on the surface of each of the wafers 12 and the remaining steps of the overall process relate to the removal of this surfactant residue. Rinsing is accomplished by a countercurrent dilution process in which the wafers 12 are rinsed by successively purer baths of the carrier liquid. Thus a first rinsing bath 16b is introduced to the tank 14 from a tank 24 through a filter F2 and the agitator 20 is again turn on. After a suitable interval, e.g. 1 to 10 minutes, the first rinsing bath 16b is drained slowly through a valve B and a flow restrictor 26 to a holding tank 28. Next a second rinsing bath 16c is introduced to the tank 14 through a filter F3 from a tank 30. After the second rinsing is completed, the rinsing bath 16c is drained slowly through a valve C and a flow restrictor 32 to the tank 24.

In the meantime the rinsing liquid in tank 30 is replenished by distillation of the contents of the holding tank 28 in a still 34. The still 34 separates the carrier liquid, which has a relatively low boiling point, from the surfactant, which has a higher boiling point. Thus the rinsing liquid in the tank 30 is pure carrier liquid.

The rinsing liquid in the upstream tank 24 contains surfactant in much smaller concentration than the washing liquid in the tank 18. Thus, by dilution it mechanically reduces the concentration of surfactant on the surfaces of the wafers 12. Similarly, the pure carrier liquid from the tank 30 further reduces the surface concentration of surfactant to an acceptably low level.

Each time a bath 16 is drained to the tank 18 a film of liquid, containing the surfactant, is left on the surface of each wafer 12. The thickness of this film depends on the rate at which the surface of liquid passes down along the surfaces of the wafers 12, i.e. the rate at which the wafers are, in effect, withdrawn from the baths. This film is thinner with lower draining rate and a lower rate therefore desirable, since the resulting thinner film contains less surfactant material. A preferred draining rate provides an effective wafer surface withdrawal rate of about one inch per minute. Additional rinsing steps can be introduced, depending on the rate at which the baths 16 are drained and the acceptable surface concentration of surfactant after rinsing.

The levels of washing and rinsing liquids are maintained by adding fresh washing solution and rinsing liquid from reservoirs 36 and 38, respectively. Surfactant accumulated at the bottom of the still 34 can be recycled to the reservoir 36.

Thus we have described a very effective system for the removal of very small particles from surfaces contaminated by these particles.

Because the liquids involved in cleaning the surfaces are inert and immiscible with most substances, our method can be used to clean a wide range of materials, such as metals, ceramics and plastics. The invention is relatively inexpensive to use, both because it cleans surfaces relatively rapidly and also because the liquids involved in the cleaning process are easily recycled for repeated use.

What is claimed as new and desired to be secured by Letters Patent of the United States is:

1. A method for the removal of sub-micron particles from a surface, which comprises the steps of:
   A. washing the surface in a solution of at least about 0.1 weight percent of a high-molecular-weight highly-fluorinated organic surfactant in a non-polar highly-fluorinated organic carrier liquid to remove the particles from the surface and disperse them in the solution;
   B. subsequently rinsing the surface in a rinsing liquid consisting of a highly-fluorinated organic liquid to remove the surfactant residue therefrom; and
   C. removing the rinsing liquid from the surface.

2. The method, as claimed in claim 1, in which said solution has a concentration of said surfactant in the range of 0.2 to 2.0 weight-percent.

3. The method, as claimed in claim 1, in which the rinsing liquid is the carrier liquid.

4. The method, as claimed in claim 1, in which the carrier liquid is a perfluorinated liquid.

5. The method, as claimed in claim 1, in which the carrier liquid has a boiling point at ambient pressure in the range of from 35° C. to 150° C.

6. The method, as claimed in claim 1, in which the surfactant is a perfluorinated liquid containing 20 to 100 carbon atoms and one or more polar groups with active hydrogen atoms.

7. The method, as claimed in claim 1, in which the rinsing process is performed at an elevated temperature.

8. The method, as claimed in claim 1, in which the carrier liquid has a lower boiling point than the surfactant.

9. The method, as claimed in claim 1, in which:
   A. the surface is effectively withdrawn from the liquid after each step; and
   B. the rate of withdrawal is no greater than approximately one inch per minute.

10. The method, as claimed in claim 1, including successive rinsing steps beginning with a first step and ending with a last step.

11. The method, as claimed in claim 10, in which each rinsing step rinses with liquid containing a lower surfactant concentration than the previous rinsing step.

12. The method, as claimed in claim 10, in which the liquid in each rinsing step except the last step is liquid used in the subsequent rinsing step in rinsing the articles previously cleaned by said method.

13. The method, as claimed in claim 12, in which the liquid in the last step is distilled from the liquid previously used in the first rinsing step.

14. The method, as claimed in claim 1, including the application of ultrasonic agitation to the washing bath.

* * * * *